(12) United States Patent
Yang et al.

(10) Patent No.: US 8,119,500 B2
(45) Date of Patent: Feb. 21, 2012

(54) WAFER BONDING

(75) Inventors: Ku-Feng Yang, Dali (TW); Weng-Jin Wu, Hsinchu (TW); Wen-Chih Chiou, Miaoli (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 29 days.

(21) Appl. No.: 11/740,178

(22) Filed: Apr. 25, 2007

(65) Prior Publication Data

US 2008/0268614 A1    Oct. 30, 2008

(51) Int. Cl.
*H01L 21/30* (2006.01)

(52) U.S. Cl. .............. 438/459; 438/455; 257/E21.237

(58) Field of Classification Search .......... 438/455, 438/459, 690; 257/E21.237
See application file for complete search history.

(56) References Cited

U.S. PATENT DOCUMENTS

| | | | |
|---|---|---|---|
| 6,110,391 A * | 8/2000 | Takei et al. ............ 216/2 |
| 6,358,570 B1 * | 3/2002 | Affinito ............ 427/495 |
| 6,762,076 B2 | 7/2004 | Kim et al. | |
| 6,841,848 B2 | 1/2005 | MacNamara et al. | |
| 7,087,538 B2 * | 8/2006 | Staines et al. ............ 438/782 |
| 7,129,172 B2 * | 10/2006 | Morrow et al. ............ 438/690 |
| 7,186,637 B2 | 3/2007 | Kloster et al. | |
| 7,807,550 B2 * | 10/2010 | Ouellet et al. ............ 438/456 |
| 2004/0137697 A1 * | 7/2004 | Tomita ............ 438/455 |
| 2004/0144487 A1 * | 7/2004 | Martinez et al. ............ 156/344 |
| 2005/0003650 A1 * | 1/2005 | Ramanathan et al. ........ 438/614 |
| 2005/0161808 A1 * | 7/2005 | Anderson ............ 257/730 |
| 2006/0035476 A1 * | 2/2006 | Staines et al. ............ 438/782 |
| 2006/0109015 A1 * | 5/2006 | Thacker et al. ............ 324/754 |
| 2006/0219351 A1 * | 10/2006 | Kuan et al. ............ 156/247 |
| 2007/0111386 A1 * | 5/2007 | Kim et al. ............ 438/107 |

OTHER PUBLICATIONS

M.Quirk and J.Serda, "Semiconductor Manufacturing Technology", Prentice-Hall, NJ, 2001, pp. 82, 83, 574.*
"Press Release—Disco Corporation," http://www.disco.co.jp/eg/news/press/20031125_1.html Nov. 25, 2003 [online] 2 pages, downloaded Jul. 10, 2007.
"Ultra-Thin Grinding—Disco Corporation," http://www.disco.co.jp/eg/solution/library/thin.html [online] 3 pages, downloaded Jul. 10, 2007.
"Applications Example—Disco Corporation," http://is01.disco.co.jp/psc/aphp.nsf/0/1C5CAEC12CEF8A334925707400 23553D [online ] 2 pages, downloaded Jul. 10, 2007.

* cited by examiner

*Primary Examiner* — Julia Slutsker
(74) *Attorney, Agent, or Firm* — Slater & Matsil, L.L.P.

(57) ABSTRACT

A method for providing a stacked wafer configuration is provided. The method includes bonding a first wafer to a second wafer. A filler material is applied in a gap formed along edges of the first wafer and the second wafer. The filler material provides support along the edges during a thinning and transportation process to help reduce cracking or chipping. The filler material may be cured to reduce any bubbling that may have occurred while applying the filler material. Thereafter, the second wafer may be thinned by grinding, plasma etching, wet etching, or the like. In some embodiments of the present invention, this process may be repeated multiple times to create a stacked wafer configuration having three or more stacked wafers.

18 Claims, 3 Drawing Sheets

WAFER BONDING

TECHNICAL FIELD

The present invention relates generally to semiconductor structures, and more particularly, to bonding multiple wafers together to create a stacked wafer configuration.

BACKGROUND

Semiconductor chips used in electronic devices comprise a semiconductor die mounted on a carrier or a substrate. In an effort to increase the density and functionality of a semiconductor chip, attempts have been made to create 3D-ICs, or three-dimensional integrated circuits. Generally, 3D-ICs comprise a plurality of semiconductor dies stacked upon each other, such as one semiconductor die bonded on top of another semiconductor die. Electrical connections electrically couple contact pads on each of the stacked semiconductor dies to external contacts. The dies may include different functionality or simply increase the density of a single functionality, such as a memory.

Generally, attempts at creating 3D-ICs have included bonding a first wafer on which a plurality of dies has been formed to a second wafer, also on which a plurality of dies has been formed. The wafers are aligned such that the dies of one wafer are aligned with dies of the other wafer. As mentioned above, the dies of the wafers may have a different function or provide increased density for a single type of function, such as memory. Once bonded, a thinning process is typically performed to form electrical connections, typically by exposing a through silicon via that is electrically coupled to the bottom wafer. During the thinning process, however, the wafer often cracks and chips because the edges of the wafer are unsupported.

One attempt at preventing cracks and chips during the thinning process involved etching a notch along the periphery of the wafer to be thinned. Another attempt involved sawing an edge of the wafer to be thinned off, and then thinning the wafer. These attempts, however, reduce the wafer size and often include additional timely processes. Furthermore, these attempts may also require specialized equipment or may be incompatible with processes used by some fabricators.

Accordingly, there is a need for an efficient and effective method to create a stacked wafer configuration.

SUMMARY OF THE INVENTION

These and other problems are generally solved or circumvented, and technical advantages are generally achieved, by preferred embodiments of the present invention which provides a method of packaging a semiconductor structure such that a cavity is formed therein.

In accordance with an embodiment of the present invention, a method of forming a stacked wafer configuration is provided. The method includes bonding a first wafer to a second wafer such that a gap is formed between the outer edges of the first wafer and the second wafer. The gap is filled with a sealing layer, and thereafter, a thinning process is performed to thin the first wafer. A curing process may also be performed to reduce bubbling in the sealing layer prior to the thinning process.

In accordance with another embodiment of the present invention, a first wafer and a second wafer having non-perpendicular edges are bonded together. A supporting material is provided in a gap formed between the outer edges of the first wafer and the second wafer. Thereafter, a thinning process is performed. A curing process may also be performed.

In accordance with yet another embodiment of the present invention, three or more wafers may be bonded together. A first wafer is bonded to a second wafer, a gap between outer edges of the first wafer and the second wafer is filled with a supporting material, and the second wafer is thinned. A third wafer is then bonded to the second wafer and a gap between outer edges of the second wafer and the third wafer is filled with a supporting material. The third wafer is then thinned. This process may be repeated to create stacked configurations of four or more wafers.

In accordance with yet another embodiment of the present invention, a first wafer having a first set of contacts is bonded to a second wafer having a second set of contacts, wherein the first set of contacts is electrically coupled to respective ones of the second set of contacts. The second set of contacts is electrically coupled to respective ones of through silicon vias that extend at least partially through the second wafer. A gap between outer edges of the first wafer and the second wafer is filled, and the second wafer is thinned, thereby exposing the through silicon vias. A curing process may be performed prior to the thinning process.

It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
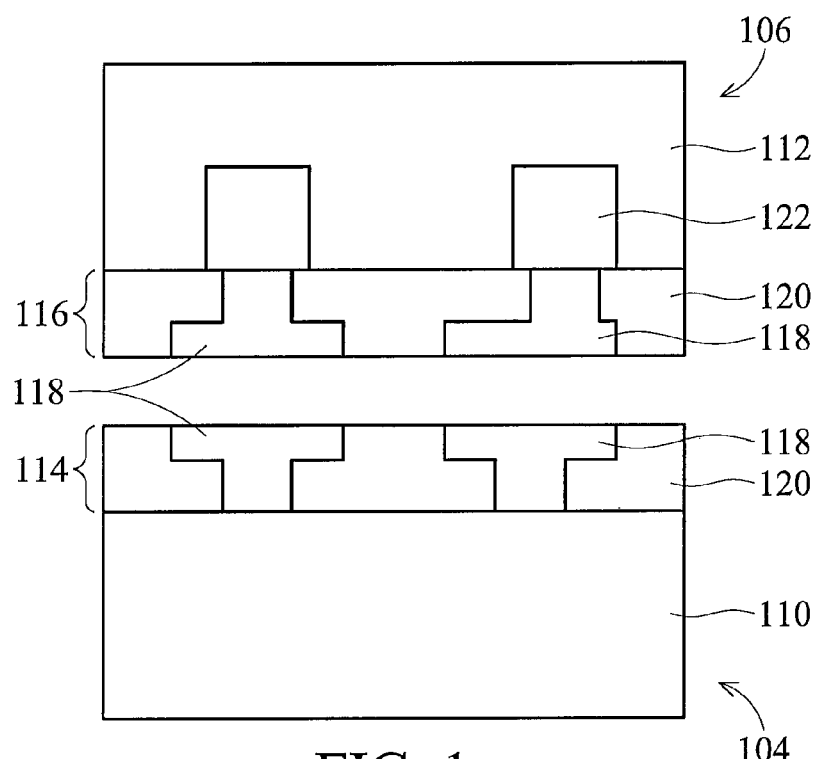
FIGS. 1-5 illustrate a method of bonding a first wafer to a second wafer in accordance with an embodiment of the present invention.

Referring first to FIG. 1, a first wafer 104 and a second wafer 106 are shown being prepared to be bonded in accordance with an embodiment of the present invention. The first wafer 104 and the second wafer 106 comprise a first semiconductor substrate 110 and a second semiconductor substrate 112, respectively, with electronic circuitry (not shown) formed thereon. The first semiconductor substrate 110 and the second semiconductor substrate 112 may each comprise bulk silicon, doped or undoped, or an active layer of a semiconductor-on-insulator (SOI) substrate. Generally, an SOI comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as a multi-layered or gradient substrate may also be used.

The circuitry formed on the substrate may be any type of circuitry suitable for a particular application. In an embodiment, the circuitry includes electrical devices formed on the substrate with one or more dielectric layers overlying the electrical devices. Metal layers may be formed between dielectric layers to route electrical signals between the electrical devices. Electrical devices may also be formed in the one or more dielectric layers.

For example, the circuitry may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of the present invention and are not meant to limit the present invention in any manner. Other circuitry may be used as appropriate for a given application.

The first wafer 104 and the second wafer 106 have a first interconnect layer 114 and a second interconnect layer 116, respectively, formed thereon. Each of the first interconnect layer 114 and the second interconnect layer 116 includes contacts 118 formed in one or more dielectric layers 120. Generally, the one or more dielectric layers 120 may be formed, for example, of a low-K dielectric material, silicon oxide, phosphosilicate glass (PSG), borophosphosilicate glass (BPSG), fluorinated silicate glass (FSG), or the like, by any suitable method known in the art. In an embodiment, the one or more dielectric layers 120 comprise an oxide that may be formed by chemical vapor deposition (CVD) techniques using tetra-ethyl-ortho-silicate (TEOS) and oxygen as a precursor. Other materials and processes may be used. It should also be noted that the dielectric layers 120 may each comprise a plurality of dielectric layers, with or without an etch stop layer formed between dielectric layers.

The contacts 118 may be formed in the dielectric layers 120 by any suitable process, including photolithography and etching techniques. Generally, photolithography techniques involve depositing a photoresist material, which is masked, exposed, and developed to expose portions of the dielectric layers 120 that are to be removed. The remaining photoresist material protects the underlying material from subsequent processing steps, such as etching. In the preferred embodiment, photoresist material is utilized to create a patterned mask to define contacts 118. The etching process may be an anisotropic or isotropic etch process, but preferably is an anisotropic dry etch process. After the etching process, any remaining photoresist material may be removed. Processes that may be used to form the contacts 118 include single and dual damascene processes.

The contacts 118 may be formed of any suitable conductive material, but is preferably formed of a highly-conductive, low-resistive metal, elemental metal, transition metal, or the like. Furthermore, the contacts 118 may include a barrier/adhesion layer to prevent diffusion and provide better adhesion between the contacts 118 and the dielectric layers 120. A chemical-mechanical polishing (CMP) process may be performed to planarize the surface of the first wafer 104 and the second wafer 106.

It should be noted that in the embodiment illustrated in FIG. 1, the contacts 118 formed on the first semiconductor wafer 104 may connect to any type of semiconductor structure (not shown), such as transistors, capacitors, resistors, or the like, or an intermediate contact point, such as a metal interconnect or the like.

Also illustrated in FIG. 1 are through-silicon vias (TSVs) 122 formed in the second semiconductor substrate 112. The TSVs 122 may be formed of any suitable conductive material, but are preferably formed of a highly-conductive, low-resistive metal, elemental metal, transition metal, or the like. For example, in an embodiment the TSVs are filled with Cu, W, or the like. The TSVs 122 are electrically coupled to respective ones of the contacts 118 on the second wafer 106. As will be discussed below, the second wafer 106 will be thinned, thereby exposing the TSVs 122. In this manner, electrical contacts to the first wafer 104 will be formed on the opposing side of the second wafer 106.

Figure 2:
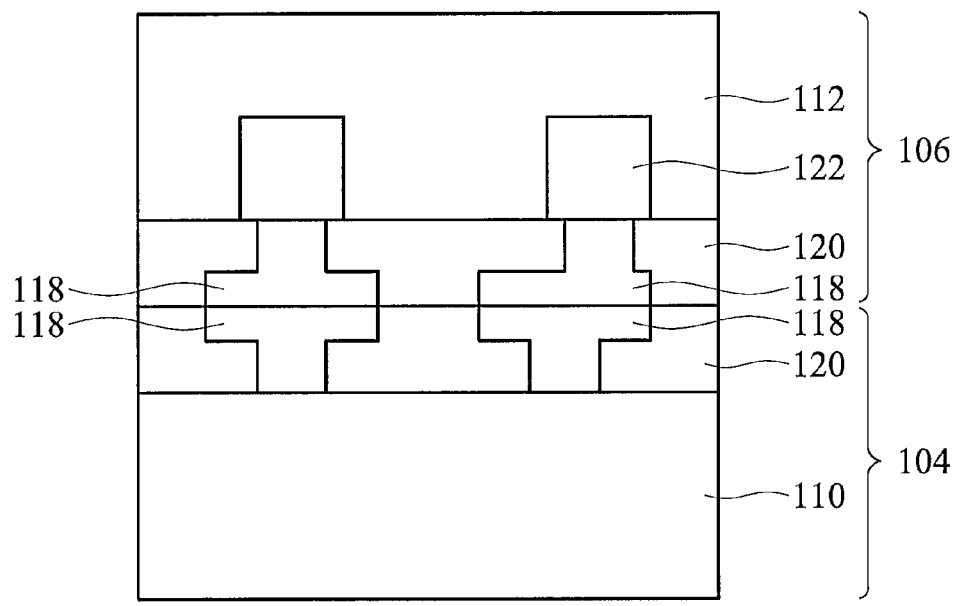

FIG. 2 illustrates the first wafer 104 and the second wafer 106 after a bonding procedure has been performed in accordance with an embodiment of the present invention. The bonding procedure may include any suitable bonding procedure for the specific application and materials. For example, direct bonding, metal diffusion, anodic, oxide fusion bonding, and the like bonding methods may be performed. In an embodiment, a conductive metal or metal alloy, such as Cu, W, CuSn, AuSn, InAu, PbSn, or the like, is utilized as a bonding material to directly bond contacts on the first wafer 104 to the corresponding contacts on the second wafer 106. In another embodiment, a polymer, such as bis-benzocyclobutene (BCB), epoxy, an organic glue, or the like, is utilized as a bonding material. In this embodiment, the bonding material may be applied to the dielectric layer 120 of the first wafer 104 and/or the second wafer 106.

Figure 3:
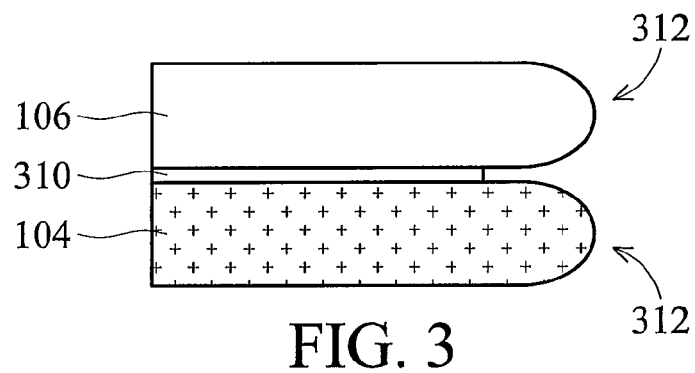

FIG. 3 illustrates a larger portion of the first wafer 104 and the second wafer 106 after the bonding procedure discussed above has been performed in accordance with an embodiment of the present invention. In FIG. 3, an adhesive layer 310 is shown to illustrate the bonding procedure. One of ordinary skill in the art, however, will realize that FIG. 3 is a simplification of the bonding and that the actual bonding mechanism used may vary in, for example, application, materials, shape, size, and the like.

FIG. 3 also illustrates that edges 312 of the first wafer 104 and the second wafer 106 are generally non-perpendicular, beveled, or rounded. As a result, the wafer edges 312 of the second wafer 106 are not supported by the edge of the first wafer 104 and may break off during a thinning process performed on the second wafer 106.

Figure 4:
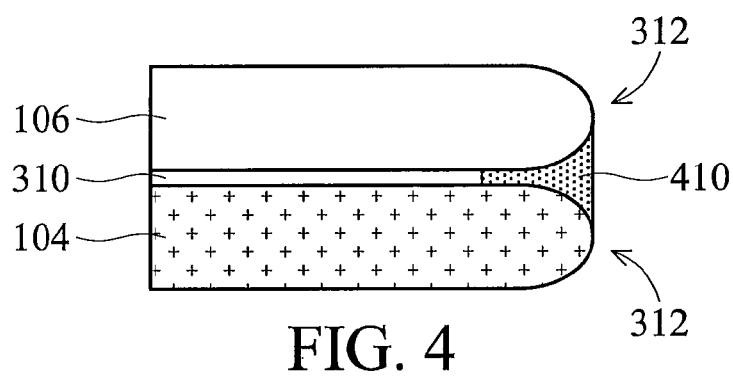

FIG. 4 illustrates the first wafer 104 and the second wafer 106 of FIG. 3 after a sealing layer 410 has been applied to the wafer edges 312 in accordance with an embodiment of the present invention. The sealing layer 410 preferably comprises a high heat resistant material that has been applied and cured in a vacuum. It should be noted that the sealing layer 410 is illustrated as a single layer for illustrative purposes only and may comprise a plurality of layers of different materials. Suitable materials that may be used to form the sealing layer 410 include polyimide, BCB, SOG, $SiO_x$, $SiN_x$, $SiON_x$, other inorganic materials, other silicon-related materials, other high thermal stable polymers, and the like.

Figure 4A:
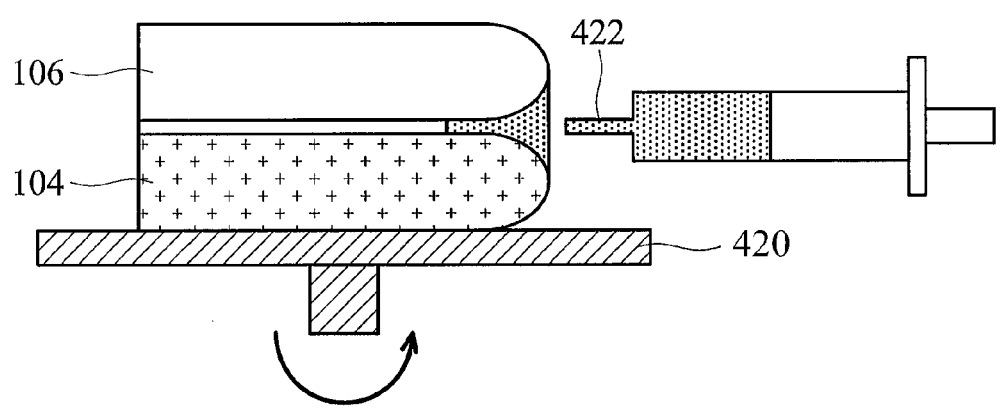

The sealing layer 410 may be applied by any suitable method, including injection, dispensing, printing, or other coating methods. In an embodiment, illustrated in FIG. 4a, the first wafer 104 and the second wafer 106 are bonded together and placed on a rotating platform 420. A static injector 422 is positioned such that the sealing layer 410 may be injected along the wafer edges 312 between the first wafer 104 and the second wafer 106 as the rotating platform 420 is rotated. The rotation of the first wafer 104 and the second wafer 106 may help smooth and seal the sealing layer 410 along the wafer edges 312.

In an embodiment, the sealing layer 410 extends substantially to the outermost edge of the first wafer 104 and the second wafer 106, as is illustrated in FIG. 4. However, one of ordinary skill in the art will realize that one of the functions of the sealing layer 410 is to provide structural support for the second wafer 106 during a subsequent thinning process, and as such, it may not be necessary to extend the sealing layer 410 to the outermost edge of the first wafer 104 and the second wafer 106, dependent upon, among other things, the shape of the wafer edges 312, the thickness of the wafers, the amount to be thinned, the intended profile, the materials, and the like. In an embodiment, a curing process, which may be performed in a vacuum, is performed to remove any bubbles that may have been formed when applying the sealing layer 410.

Figure 5:
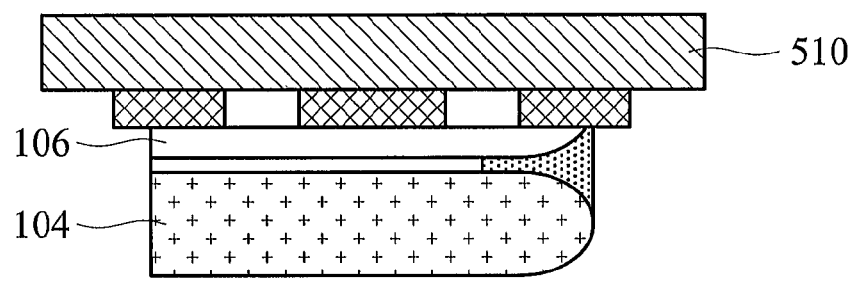

FIG. 5 illustrates the first wafer 104 and the second wafer 106 as a thinning process is being performed in accordance with an embodiment of the present invention. In the embodiment illustrated in FIG. 5, the thinning process comprises using a grinder 510 in a grinding process to reduce the thickness of the second wafer 106. One of ordinary skill in the art will realize that other thinning processes, such as a polish process (including a wet polish (CMP) and a dry polish), a plasma etch process, a wet etch process, or the like, may also be used.

It should be noted that the thinning process exposes the TSVs 122 (see FIG. 1). In this manner, the TSVs provide an electrical connection to circuitry included on the first wafer 104 through the second wafer 106.

As one of ordinary skill in the art will appreciate, the sealing layer 410 provides additional support for the wafer edges 312 during the thinning process, thereby preventing or reducing cracking or chipping. As a result, higher yields may be obtained, reducing costs and increasing revenues.

Figure 6:
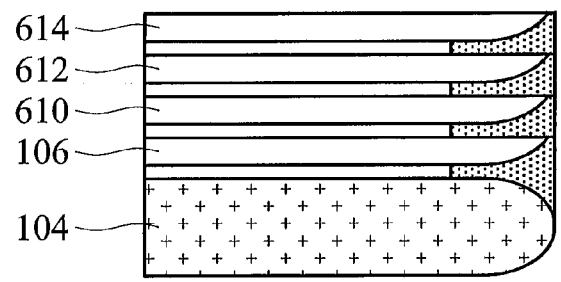
FIG. 6 illustrates a stacked wafer configuration having five wafers in accordance with an embodiment of the present invention.

FIG. 6 illustrates an embodiment in which the processes described above are repeated multiple times to create stacked wafer configurations having three or more wafers in accordance with an embodiment of the present invention. In the embodiment illustrated in FIG. 6, a stacked wafer configuration having five wafers is illustrated. Wafers 104 and 106 correspond to the corresponding wafers of FIGS. 1-5, and wafers 610-614 represent additional wafers that may be stacked on top of the second wafer 106 using a process similar to that discussed above with reference to FIGS. 1-5.

Although the present invention and its advantages have been described in detail, it should be understood that various changes, substitutions and alterations can be made herein without departing from the spirit and scope of the invention as defined by the appended claims. For example, different types of materials and processes may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method comprising:
   bonding a first wafer to a lower surface of a second wafer, a first gap being defined by an unfilled area between outer edges of the first wafer and the second wafer after the bonding, each of the first wafer and the second wafer having electronic circuitry formed thereon;
   providing a sealing layer in the first gap, the sealing layer at least partially filling the first gap, but not extending over edges of the first wafer and the second wafer, wherein the edges of the second wafer comprise a non-perpendicular rounded shape joining a periphery of the lower surface with a periphery of an opposite upper surface of the second wafer, and wherein a diameter of the second wafer is larger within the second wafer than the lower or the upper surface of the second wafer; and
   thinning the second wafer after the providing until the sealing layer under the second wafer is exposed and until the upper surface of the second wafer has a diameter less than the first wafer and greater than the lower surface of the second wafer, a thinned surface of the second wafer being co-planar with a surface of the sealing layer, the thinning being performed on at least a portion of the second wafer overlying the sealing layer.

2. The method of claim 1, wherein the sealing layer extends to an outer edge of the first wafer and the second wafer.

3. The method of claim 1, wherein the thinning step is performed at least in part by grinding, a wet polish, a dry polish, a plasma etch, or a wet etch.

4. The method of claim 1, further comprising curing the sealing layer prior to the thinning step.

5. The method of claim 1, wherein the providing the sealing layer comprises:
   providing a rotating platform;
   placing the bonded first wafer and second wafer on the rotating platform;
   providing a static syringe positioned to inject material along outer edges between the first wafer and the second wafer; and
   injecting the sealing layer with the static syringe while the bonded first wafer and second wafer are rotating.

6. The method of claim 1, wherein the second wafer comprises deep vias electrically coupled to respective ones of electrical contacts on the first wafer, the thinning process at least partially exposing the deep vias.

7. A method comprising;
   providing a first wafer, the first wafer having a non-perpendicular edge;
   providing a second wafer, the second wafer having a non-perpendicular edge;
   bonding the first wafer to the second wafer such that a first gap is formed between the non-perpendicular edges of the first wafer and the second wafer;
   providing a supporting material in at least a portion of the first gap, the supporting material not extending beyond edges of the first wafer and the second wafer, wherein the supporting material comprises a plurality of layers of different materials; and
   thinning the first wafer until an upper surface of the first wafer has a first maximum diameter less than a second diameter of the second wafer and greater than a diameter of a lower surface of the first wafer, at least a portion of the first wafer overlying the supporting material is thinned, a thinned surface of the first wafer being coplanar with a surface of the supporting material.

8. The method of claim 7, wherein the supporting material extends to an outer edge of the first wafer and the second wafer.

9. The method of claim 7, wherein the thinning process is performed at least in part by grinding, a wet polish, a dry polish, a plasma etch, or a wet etch.

10. The method of claim 7, further comprising curing the supporting material in a vacuum prior to the thinning step.

11. The method of claim 7, wherein the providing the supporting material is performed at least in part by a static syringe while the first wafer and the second wafer are rotated.

12. The method of claim 7, further comprising:
bonding a third wafer on the first wafer after the thinning of the first wafer, outer edges of the third wafer and the first wafer having a second gap;
providing additional supporting material in at least a portion of the second gap; and
thinning the third wafer such that at least a portion of the third wafer overlying the additional supporting material is thinned.

13. A method comprising:
providing a first wafer having a first set of contacts;
providing a second wafer having a first side and a second side and having a second set of contacts on the first side of the second wafer, the second set of contacts being electrically coupled to through silicon vias, the through silicon vias extending at least partially through the second wafer;
bonding the first wafer to the second wafer such that the first set of contacts is electrically coupled to respective ones of the second set of contacts;
filling a gap between outer edges of the first wafer and the second wafer with a supporting material, the supporting material not extending beyond the first wafer and the second wafer, wherein the supporting material comprises a plurality of layers of different materials; and
thinning the second side of the second wafer using at least in part a grinding process, the grinding process exposing the through silicon vias, vias and generating a first diameter of the thinned second side until the first diameter is greater than a second diameter of the first side of the second wafer and less than a third diameter of the first wafer, wherein at least a portion of the supporting material is exposed during the thinning step.

14. The method of claim 13, wherein the supporting material extends to the outer edge of the first wafer and the second wafer.

15. The method of claim 13, further comprising curing the supporting material in a vacuum prior to the thinning step.

16. The method of claim 13, wherein the filling the gap is performed at least in part by a static syringe while the first wafer and the second wafer are rotated.

17. The method of claim 7, wherein the plurality of layers are selected from the group consisting of polymide, BCB, SOG, $SiO_x$, $SiN_x$, and $SiON_x$.

18. The method of claim 13, wherein the plurality of layers are selected from the group consisting of $SiO_x$, $SiN_x$, and $SiON_x$.

* * * * *

UNITED STATES PATENT AND TRADEMARK OFFICE
CERTIFICATE OF CORRECTION

| | | |
|---|---|---|
| PATENT NO. | : 8,119,500 B2 | |
| APPLICATION NO. | : 11/740178 | |
| DATED | : February 21, 2012 | |
| INVENTOR(S) | : Yang et al. | |

It is certified that error appears in the above-identified patent and that said Letters Patent is hereby corrected as shown below:

In Col. 8, line 11, claim 13, after "through silicon" delete "vias,".

Signed and Sealed this
Twenty-ninth Day of May, 2012

David J. Kappos
*Director of the United States Patent and Trademark Office*